United States Patent
Tuncer

(10) Patent No.: US 11,879,790 B2
(45) Date of Patent: Jan. 23, 2024

(54) ISOLATED TEMPERATURE SENSOR PACKAGE WITH EMBEDDED SPACER IN DIELECTRIC OPENING

(71) Applicant: TEXAS INSTRUMENTS INCORPORATED, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 198 days.

(21) Appl. No.: 17/513,259

(22) Filed: Oct. 28, 2021

(65) Prior Publication Data

US 2023/0138475 A1 May 4, 2023

(51) Int. Cl.
| | |
|---|---|
| H01L 23/00 | (2006.01) |
| G01K 7/01 | (2006.01) |
| H01L 23/28 | (2006.01) |
| H01L 23/48 | (2006.01) |
| H01L 23/485 | (2006.01) |

(52) U.S. Cl.
CPC .............. *G01K 7/01* (2013.01); *H01L 23/28* (2013.01); *H01L 23/48* (2013.01); *H01L 23/485* (2013.01); *H01L 24/46* (2013.01); *H01L 2224/48091* (2013.01); *H01L 2224/73265* (2013.01)

(58) Field of Classification Search
CPC ........ H01L 23/28; H01L 23/48; H01L 23/485
See application file for complete search history.

(56) References Cited

U.S. PATENT DOCUMENTS

| | | | |
|---|---|---|---|
| 4,607,779 A | 8/1986 | Burns | |
| 5,105,258 A * | 4/1992 | Silvis | H01L 23/3736 257/E23.109 |
| 5,207,102 A * | 5/1993 | Takahashi | G01L 19/147 73/706 |
| 6,309,915 B1* | 10/2001 | Distefano | H01L 24/01 438/126 |
| 6,828,659 B2* | 12/2004 | Iwakiri | H01L 23/49503 257/676 |

(Continued)

OTHER PUBLICATIONS

Ankit Gupta and Katelyn Wiggenhorn "Enhanced HotRod Qfn Package: Achieving Low Emi Performance in Industry' Smallest 4-A Converter", Texas Instruments Application Report SNVA935 Jun. 2020.

*Primary Examiner* — Eugene Lee
(74) *Attorney, Agent, or Firm* — Ronald O. Neerings; Frank D. Cimino

(57) ABSTRACT

An electronic device includes a substrate, a dielectric spacer, a semiconductor die, and a package structure. The substrate has a dielectric layer, a die pad, first and second leads, a conductive via, and a conductive trace, the dielectric layer has an opening extending into a side, the die pad is coupled to the first lead, the second lead is coupled to the conductive via, and the conductive trace is coupled to the via. The dielectric spacer is mounted above the die pad in the opening, and the semiconductor die is mounted above the dielectric spacer, the semiconductor die includes a temperature sensor, and an electrical connection couples the semiconductor die to the conductive trace. The package structure extends on the side of the dielectric layer, on the semiconductor die, and on the conductive trace, the package structure extending around the dielectric spacer and to the die pad in the opening.

15 Claims, 12 Drawing Sheets

(56) References Cited

U.S. PATENT DOCUMENTS

| | | | | |
|---|---|---|---|---|
| 7,216,545 B2* | 5/2007 | Uchida | ............... | G01L 19/0627 |
| | | | | 73/705 |
| 8,927,339 B2* | 1/2015 | Lin | ................. | H01L 24/24 |
| | | | | 438/118 |
| 10,515,916 B2* | 12/2019 | Byun | .................. | H01L 24/09 |
| 11,605,569 B2* | 3/2023 | Tuominen | ............... | H01L 24/97 |
| 2015/0187742 A1* | 7/2015 | Kwon | .................. | H01L 24/24 |
| | | | | 438/126 |

* cited by examiner

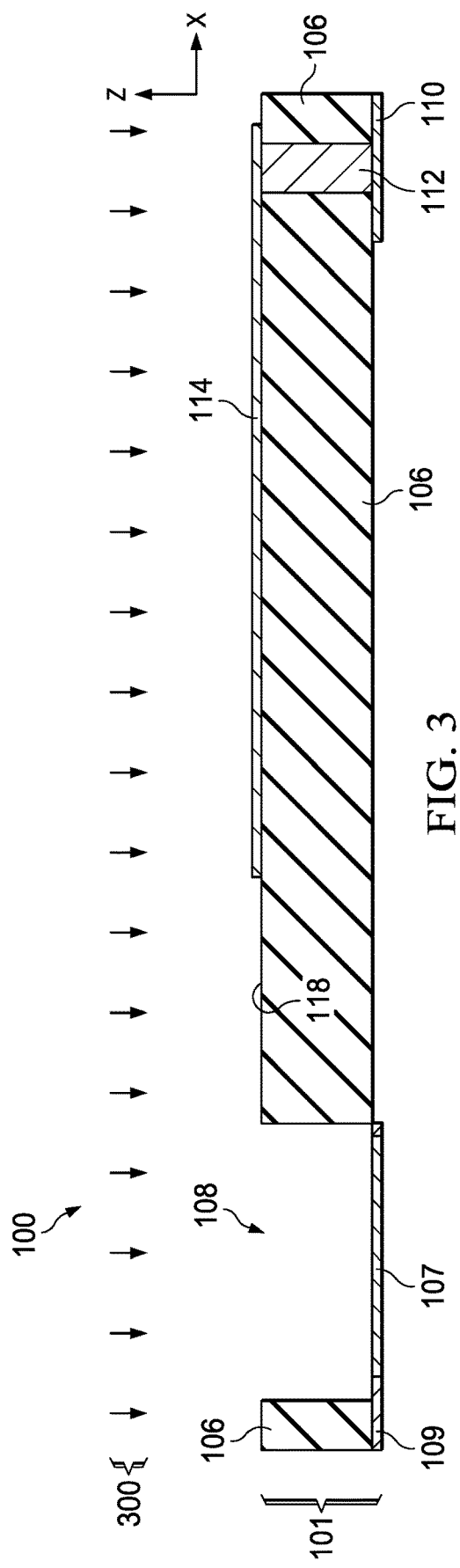
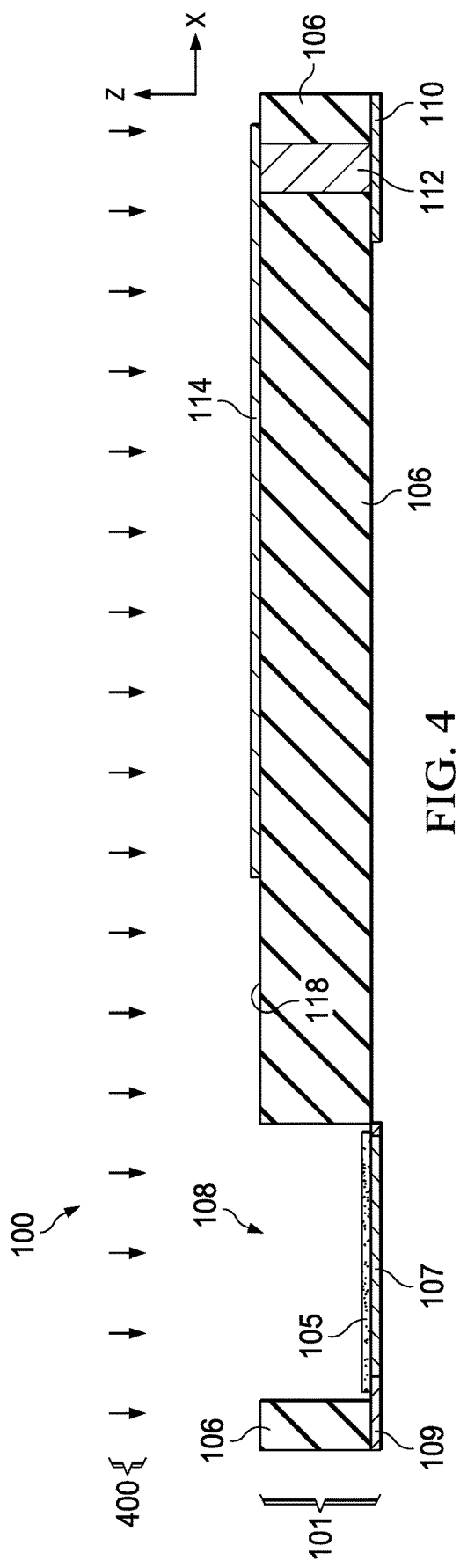

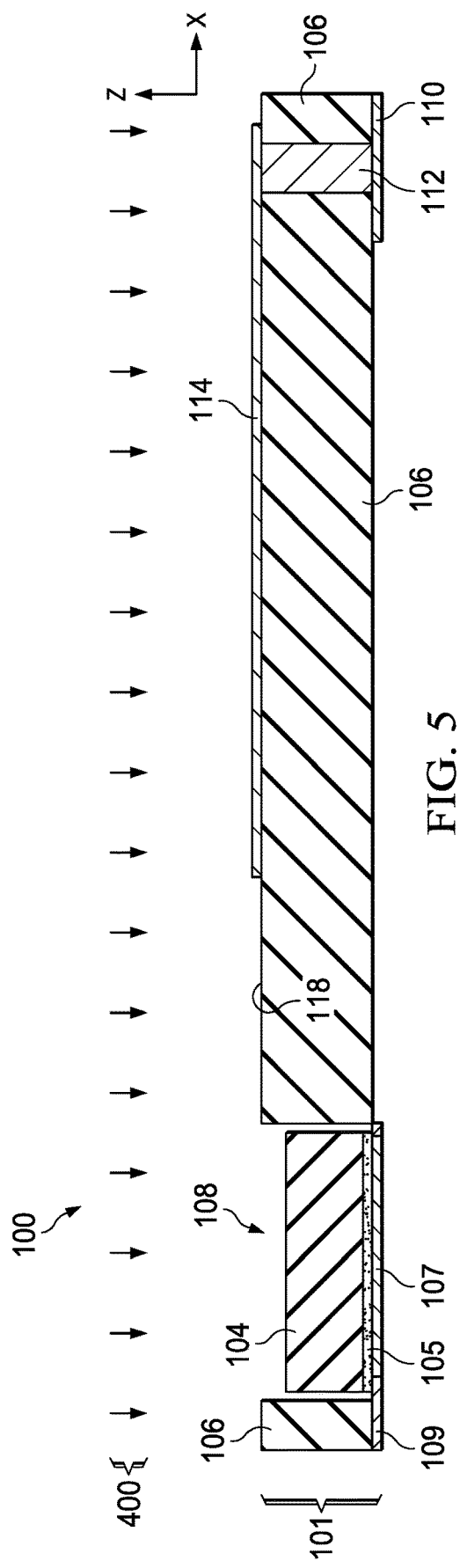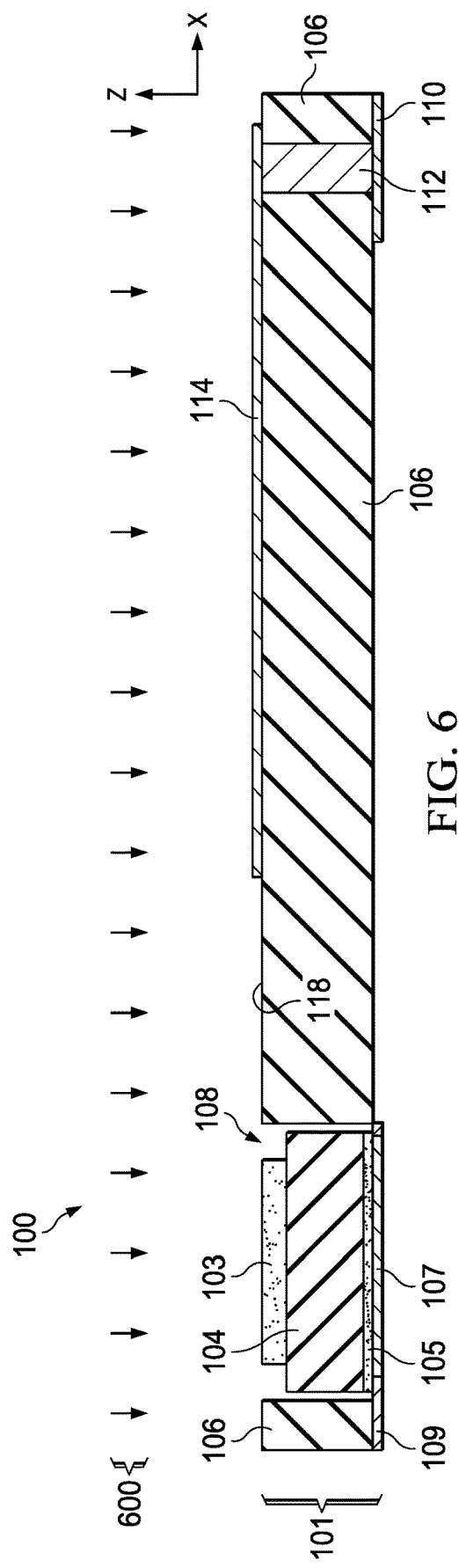

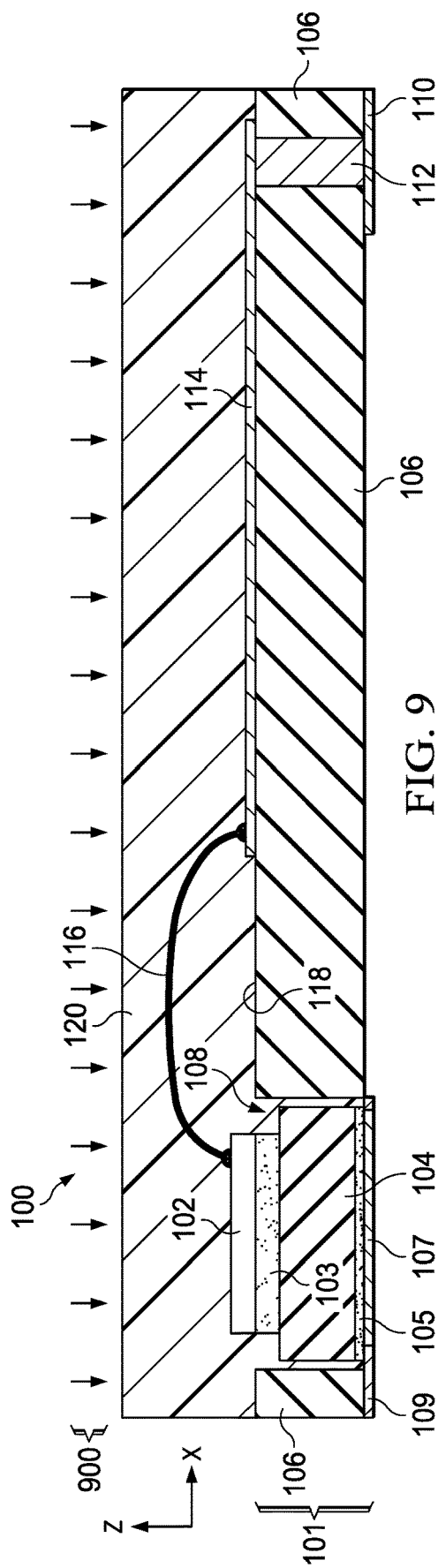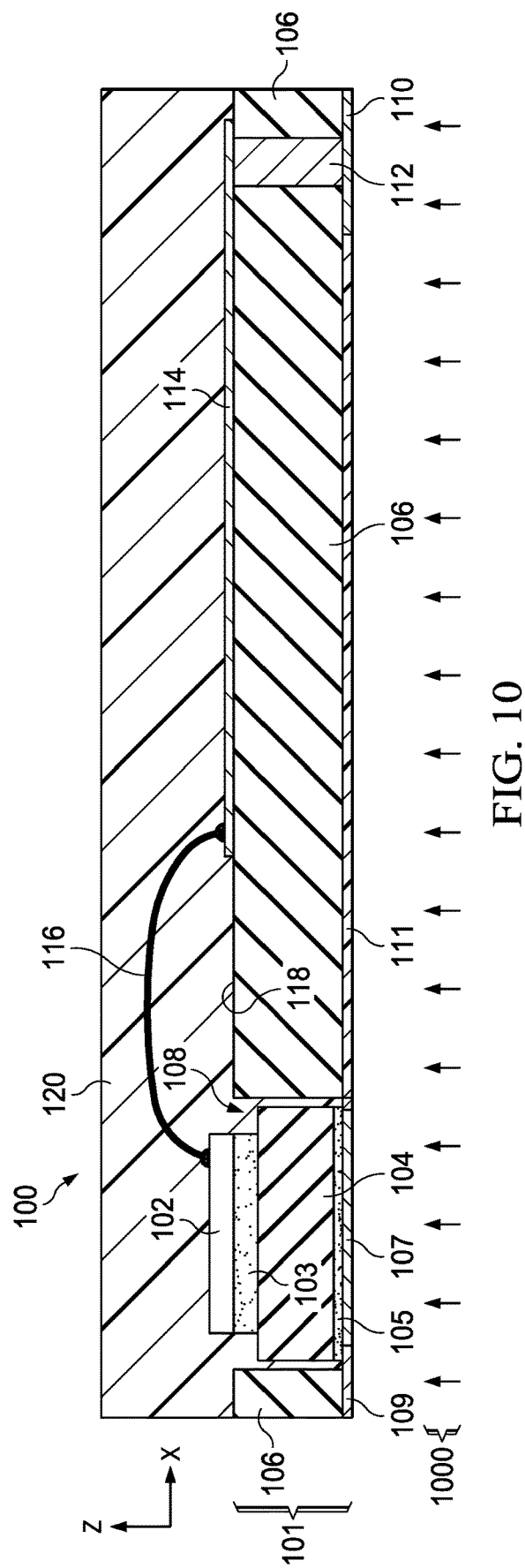

US 11,879,790 B2

ISOLATED TEMPERATURE SENSOR PACKAGE WITH EMBEDDED SPACER IN DIELECTRIC OPENING

BACKGROUND

Electronic temperature sensors can be used in high voltage systems where the temperature to be sensed is in or near a high voltage circuit. Excessive electric fields can damage or degrade a semiconductor based electronic temperature sensor.

SUMMARY

In one aspect, an electronic device includes a substrate, a dielectric spacer, a semiconductor die, and a package structure. The substrate has a dielectric layer, a die pad, first and second leads, a conductive via, and a conductive trace, the dielectric layer has an opening extending into a side, the die pad is coupled to the first lead, the second lead is coupled to the conductive via, and the conductive trace is coupled to the via. The dielectric spacer is mounted above the die pad in the opening, and the semiconductor die is mounted above the dielectric spacer, the semiconductor die includes a temperature sensor, and an electrical connection couples the semiconductor die to the conductive trace. The package structure extends on the side of the dielectric layer, on the semiconductor die, and on the conductive trace, the package structure extending around the dielectric spacer and to the die pad in the opening.

In another aspect, a method includes mounting a dielectric spacer above a die pad in an opening in a dielectric layer of a substrate, mounting a semiconductor die above the dielectric spacer, forming an electrical connection that couples the semiconductor die to a conductive trace on a side of the dielectric layer of the substrate, and performing a molding process to form a package structure that extends on the side of the dielectric layer, on the semiconductor die, and on the conductive trace, the package structure extending around the dielectric spacer and to the die pad in the opening.

In a further aspect, a system includes a printed circuit board (PCB) and an electronic device. The PCB has a conductive PCB trace. The electronic device is mounted to the PCB and includes a substrate, a dielectric spacer, a semiconductor die, and a package structure. The substrate has a dielectric layer, a die pad, first and second leads, a conductive via, and a conductive trace, and the dielectric layer has an opening extending into a side. The die pad is thermally coupled to the conductive PCB trace and the die pad is coupled to the first lead. The second lead is coupled to the conductive via, and the conductive trace is coupled to the via. The dielectric spacer is mounted above the die pad in the opening, and the semiconductor die is mounted above the dielectric spacer, the semiconductor die includes a temperature sensor, and an electrical connection couples the semiconductor die to the conductive trace. The package structure extends on the side of the dielectric layer, on the semiconductor die, and on the conductive trace, the package structure extending around the dielectric spacer and to the die pad in the opening.

BRIEF DESCRIPTION OF THE DRAWINGS

FIGS. 3-10 are sectional side elevation views of the packaged electronic device undergoing fabrication processing according to the method of FIG. 2.

DETAILED DESCRIPTION

Figure 1:
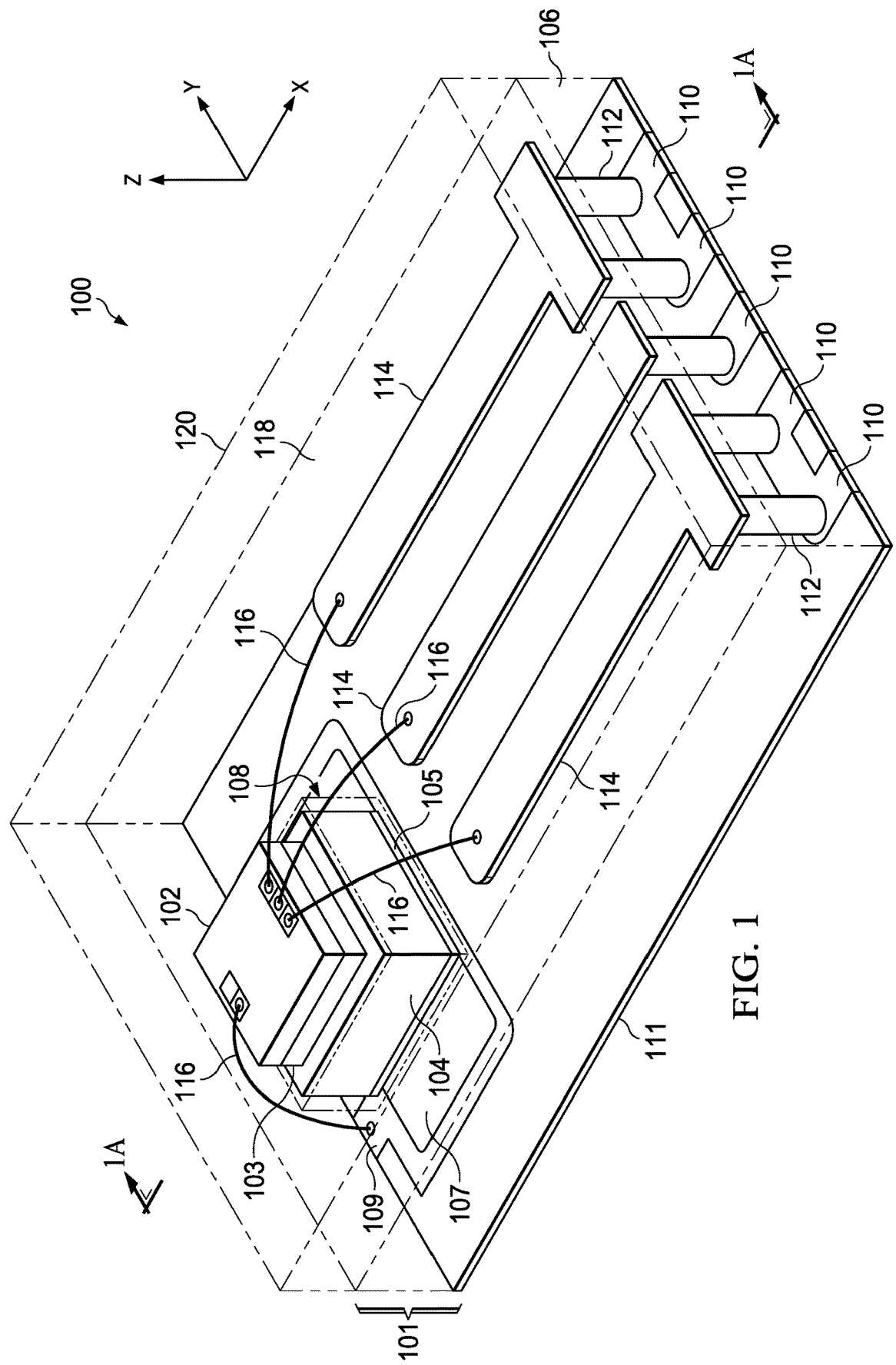
FIG. 1 is a top perspective view of a packaged electronic device with temperature sensor die mounted on a spacer in an opening of a laminate package substrate.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
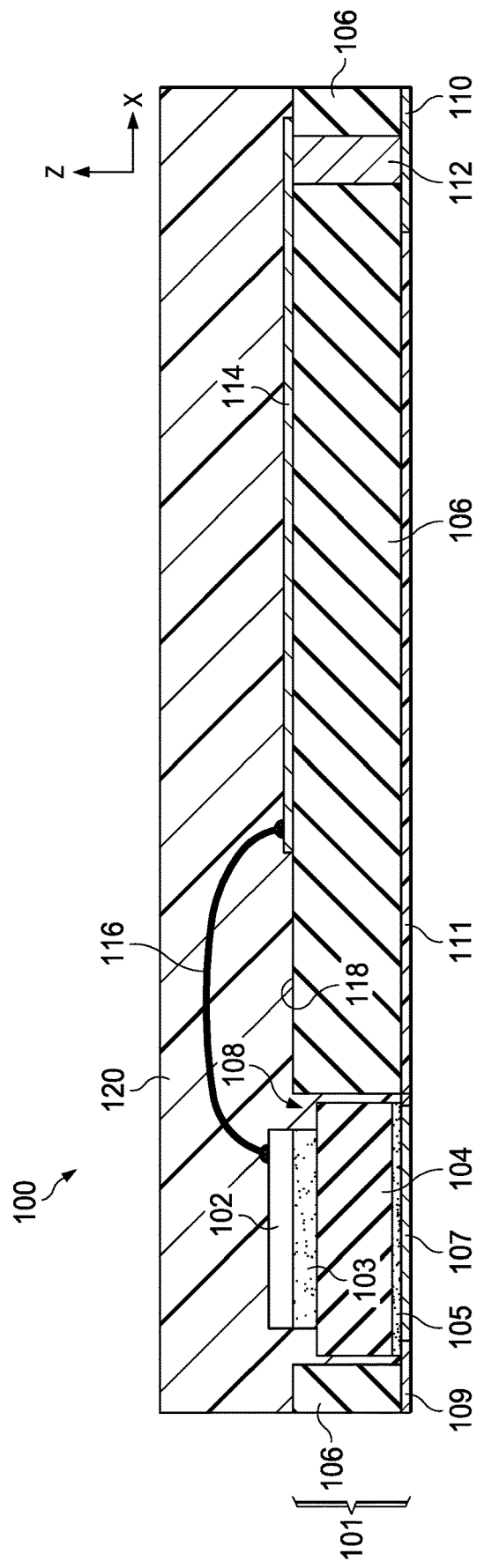
FIG. 1A is a sectional side elevation view of the packaged electronic device taken along line 1A-1A of FIG. 1.
Figure 1B:
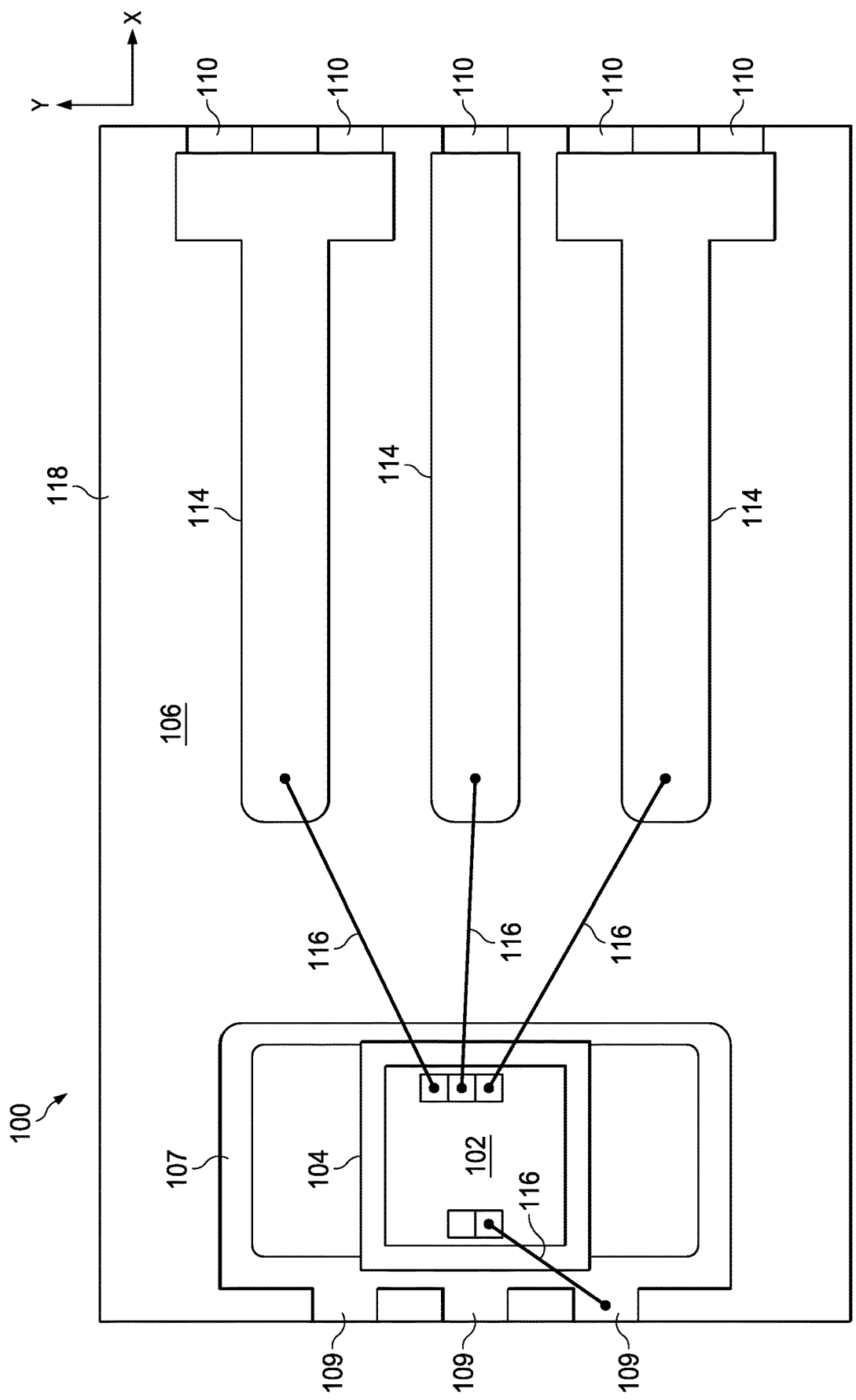
FIG. 1B is a top plan view of the packaged electronic device of FIG. 1.

Referring initially to FIGS. 1-1B, FIG. 1 shows a packaged electronic device 100 with a package substrate 101 and a temperature sensor in a semiconductor die 102 mounted using a first die attach film 103 that adheres the semiconductor die 102 to a dielectric spacer 104 to mount the semiconductor die 102 above the dielectric spacer 104. FIG. 1A shows a sectional side view of the packaged electronic device 100 taken along line 1A-1A of FIG. 1, and FIG. 1B shows a top view of the packaged electronic device 100. In one example, the substrate 101 is a lead frame. In another example, the substrate 101 is a partially etched lead frame. In another example, the substrate 101 is a pre-molded lead frame. In another example, the substrate 101 is a molded interconnect substrate (MIS). The substrate 101 is a rectangular structure in FIGS. 1-1B with lateral ends spaced apart from one another along a first direction (labeled "X" in the illustrated orientation), lateral sides spaced apart from one another along an orthogonal second direction (labeled "Y"), and top and bottom sides spaced apart from one another along a third direction (labeled "Z") that is orthogonal to the first and second directions.

The semiconductor die 102 includes a temperature sensor. The semiconductor die 102 in various implementations can be a discrete semiconductor device such as a bipolar transistor, a few discrete devices such as a pair of power FET switches fabricated together on a single semiconductor die, or an integrated circuit with multiple semiconductor devices or electronic components. The semiconductor die 102 can include passive devices such as resistors, inductors, filters, and/or can include active devices such as transistors. In the illustrated example, the semiconductor die 102 includes a temperature sensor including one or more electronic components. The temperature sensor component or circuit is configured to sense the temperature of the die pad 107 by thermal coupling of the bottom of the semiconductor die 102 through the dielectric spacer 104.

In one example, the dielectric spacer 104 is or includes aluminum oxide (e.g., $Al_2O_3$), aluminum nitride (AlN), or aluminum oxynitride. In other implementations, the dielectric spacer 104 is or includes one or more of titanium oxide ($TiO_2$), hafnium oxide ($HfO_2$), barium titanium oxide (BTO), molybdenum disulfide (MoS), silicon carbide (SiC), composites of these, and glass. In one example, the dielectric spacer 104 is a good thermal conductor with a thermal conductivity of greater than 10 W/mK to facilitate thermal transfer from the die pad 107 to the semiconductor die 102 for temperature sensing. In addition, the dielectric spacer 104 is an electrical insulator to electrically isolate low voltage temperature sensing circuitry of the semiconductor die 102 from potentially high voltages at the die pad 107 in operation of the electronic device 100. In certain examples the dielectric spacer 104 has a thickness along the Z direction of 50 to 500 μm, for example, 125 to 250 μm.

A second die attach film 105 adheres the dielectric spacer 104 to a die pad 107 of the substrate 101. The dielectric spacer 104 is mounted above the die pad 107 in an opening 108 of a dielectric layer 106. The opening 108 in FIGS. 1-1B is rectangular. In other examples, the opening can have a different shape. In one example, the dielectric layer 106 is a laminate layer of the substrate 101. In another example, the dielectric layer 106 is a molded layer of the substrate 101.

The substrate 101 has first leads 109 on one end and second leads 110 on the opposite end, for example, to allow soldering to a host printed circuit board (e.g., FIG. 14 below). In the example of FIGS. 1-1B, the substrate 101 has a solder mask 111 on the bottom side between the leads 109 and 110 and the die pad 107. The substrate 101 also has conductive vias 112 and conductive traces 114. The second leads 110 are coupled to respective ones of the conductive vias 112, and the conductive traces 114 are coupled to respective ones of the conductive vias 112. Bond wires 116 form electrical connections between individual ones of the conductive traces 114 and respective conductive pads of the semiconductor die 102. Another bond wire 116 is coupled between a further conductive pad of the semiconductor die 102 and one of the first leads 109 as shown in FIGS. 1 and 1B.

The dielectric layer 106 has a top side 118 and the opening 108 extends downward into the side 118 to the die pad 107. The die pad 107 is coupled to the first leads 109. The conductive traces 114 extend on the side 118 of the dielectric layer 106 inward from the respective vias 112 (e.g., along the negative X direction in the illustrated orientation of the electronic device 100). In the illustrated example, the top of the first die attach film 103 and the bottom of the semiconductor die 102 are approximately coplanar with the top side 118 of the dielectric layer 106. In other implementations, the bottom of the semiconductor die 102 can be above or below the plane of the top side 118 of the dielectric layer 106 along the Z direction in the illustrated orientation. In operation, when powered, the temperature sensor of the semiconductor die 102 senses the temperature of the die pad 107 through thermal coupling via the dielectric spacer 104. The dielectric spacer 104 provides high voltage isolation of the semiconductor die 102 from potentially high voltage levels of the die pad 107. One or more output signals of the semiconductor die 102 are provided via respective bond wires 116 to the conductive trace or traces 114 on the top side 118 of the dielectric layer 106, for example, in an isolated low voltage circuit of a host printed circuit board (not shown) coupled to the second lead or leads 110.

The electronic device 100 includes a package structure 120, such as mold compound material, which extends on the side 118 of the dielectric layer 106, on the semiconductor die 102, and on the conductive trace 114. The package structure 120 extends around the dielectric spacer 104 and to the die pad 107 in the opening 108, as shown in FIG. 1A. In this arrangement, the dielectric spacer 104 is of sufficient thickness such that the temperature sensor of the semiconductor die 102 is thermally coupled to a signal or surface for sensing the temperature, such as a structure soldered to the bottom of the die pad 107 and/or to one or some of the first leads 109, while the semiconductor die 102 is electrically isolated from the surface or signal to be sensed. Where the surface being sensed is at a high voltage relative to the temperature sensor of the semiconductor die 102, the semiconductor die 102 is isolated from the electric field that can occur due to the high voltage. Input and/or output signals of the conductive traces 114 and the associated bond wires 116 are also electrically isolated from the die pad 107 and can be used to provide control and data signals for the temperature sensor of the semiconductor die 102. FIG. 14 below illustrates an example of the packaged electronic device 100 installed in a system to measure the temperature of a high voltage trace of a host printed circuit board.

Referring now to FIGS. 2-10, FIG. 2 shows a method 200 for fabricating an electronic device, and FIGS. 3-10 show side views of the packaged electronic device 100 undergoing fabrication processing according to the method 200. A package substrate is fabricated at 201 with an opening in a dielectric layer. FIG. 3 shows one example, in which a process 300 is performed that provides the substrate 101 with the opening 108 in the dielectric layer 106, the conductive die pad 107 and leads 109 and 110, and the conductive traces 114 on the top side 118 of the dielectric layer 106 as described above. In one example, a laminate substrate fabrication process is used, with a laminate dielectric layer 106 having the opening 108 that exposes all or a portion of the top side of the die pad 107. In another example, a pressure molding process is used, for example, with a molded dielectric layer 106 having the opening 108.

Figure 2:
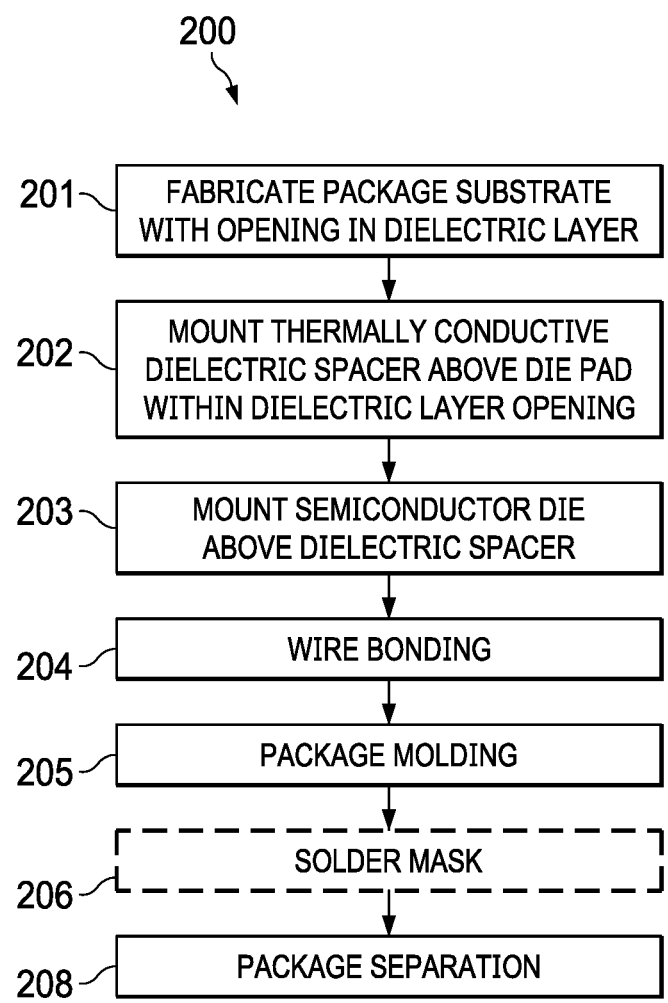
FIG. 2 is a flow diagram of a method for fabricating an electronic device.

At 202 in FIG. 2, a thermally conductive dielectric spacer is mounted above the die pad. FIGS. 4 and 5 shows one example, in which the thermally conductive dielectric spacer 104 is mounted above the die pad using the die attach film 105. A process 400 is performed to dispense or otherwise form the die attach film 105 on all or a portion of the top side of the die pad 107 exposed in the opening 108 of the dielectric layer 106. The process 400 continues in FIG. 5, where the dielectric spacer 104 is positioned or otherwise mounted to the die attach film 105 above the die pad 107.

Figure 7:
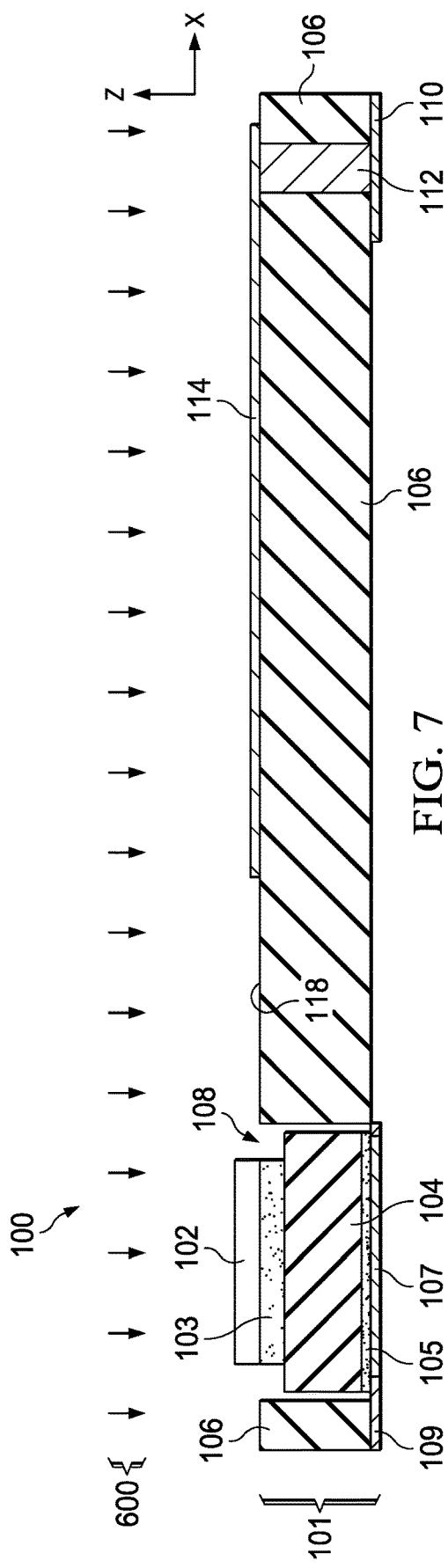

The method 200 continues at 203 in FIG. 2 with mounting a semiconductor die above the dielectric spacer. FIGS. 6 and 7 show one example in which a die attach process 600 is performed that mounts the semiconductor die 102 above the dielectric spacer 104 using the die attach film 103. In FIG. 6, the process 600 includes forming the die attach film 103 on the dielectric spacer 104. The die attach process 600 continues as shown in FIG. 7, in which the semiconductor die 102 is mounted on the die attach film 103 above the dielectric spacer 104, for example, using automated pick and place apparatus (not shown).

Figure 8:
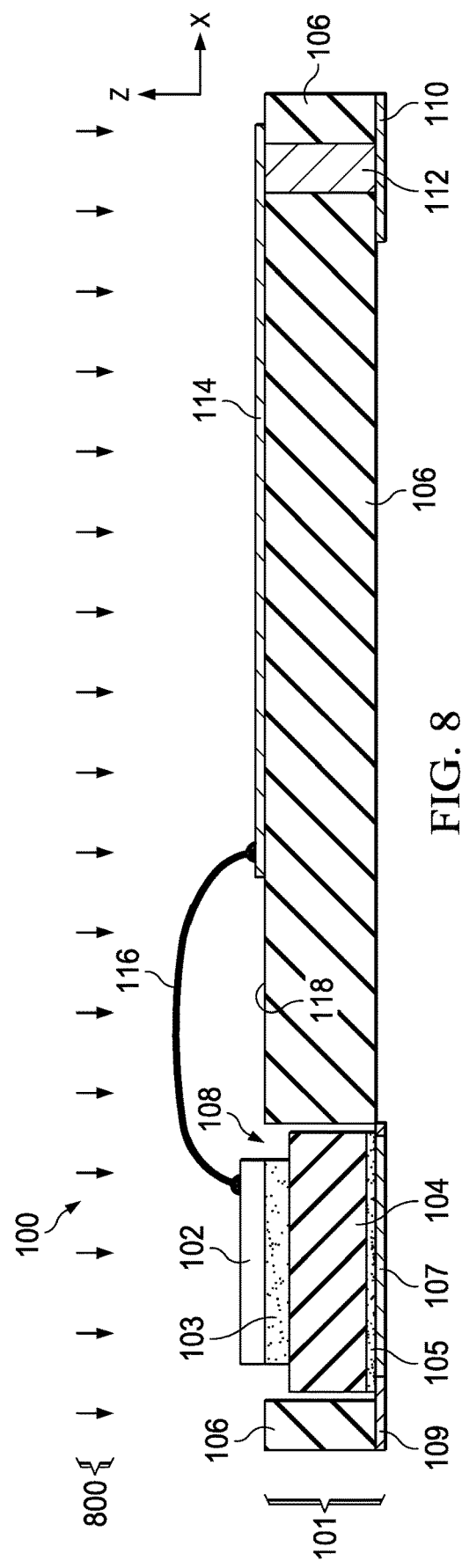

At 204 in FIG. 2, the method 200 includes forming an electrical connection that couples the semiconductor die to a conductive trace on a side of the dielectric layer of the substrate 101. FIG. 8 shows one example in which a wire bonding process 800 is performed that forms bond wires 116 between the semiconductor die 102 and the conductive trace 114 on the top side 118 of the dielectric layer 106. In another implementation, a different electrical interconnection process is used that forms one or more electrical connections that couple the semiconductor die 102 to the conductive trace 114.

The method 200 also includes package molding at 205. FIG. 9 shows one example in which a molding process 900 is performed that forms the package structure 120 extending on the top side 118 of the dielectric layer 106, on the semiconductor die 102, and on the conductive trace 114. The package structure 120 also extends around the dielectric spacer 104 and to the die pad 107 to fill the opening 108 via the molding process 900.

In one example, a solder mask is added to select portions of the bottom side of the substrate 101 at 206. FIG. 10 shows one example, in which a process 1000 is performed that forms the solder mask 111 on select portions of the bottom side of the substrate 101 between the leads 109 and 110 and the die pad 107. In another implementation, the solder mask processing at 206 is omitted.

The method 200 also includes package separation at 208. In one example, individual packaged electronic devices 100 are separated from a panel array structure at 208, for example, by sawing or laser cutting along the X and Y directions, to yield the packaged electronic device 1000 shown in FIGS. 1-1B above.

Figure 11:
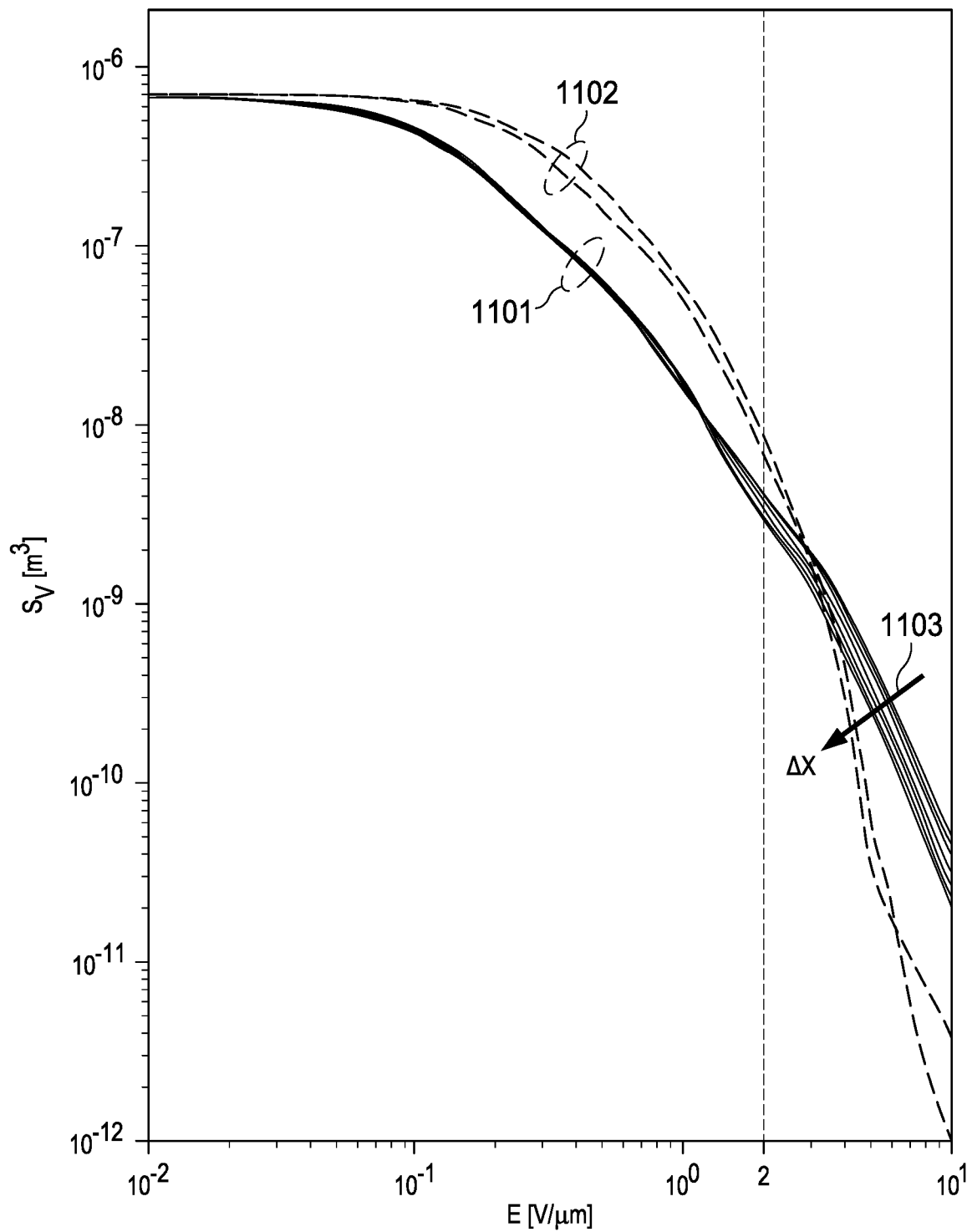
FIGS. 11, 12 and 13 show simulated stress volume performance graphs.
Figure 12:
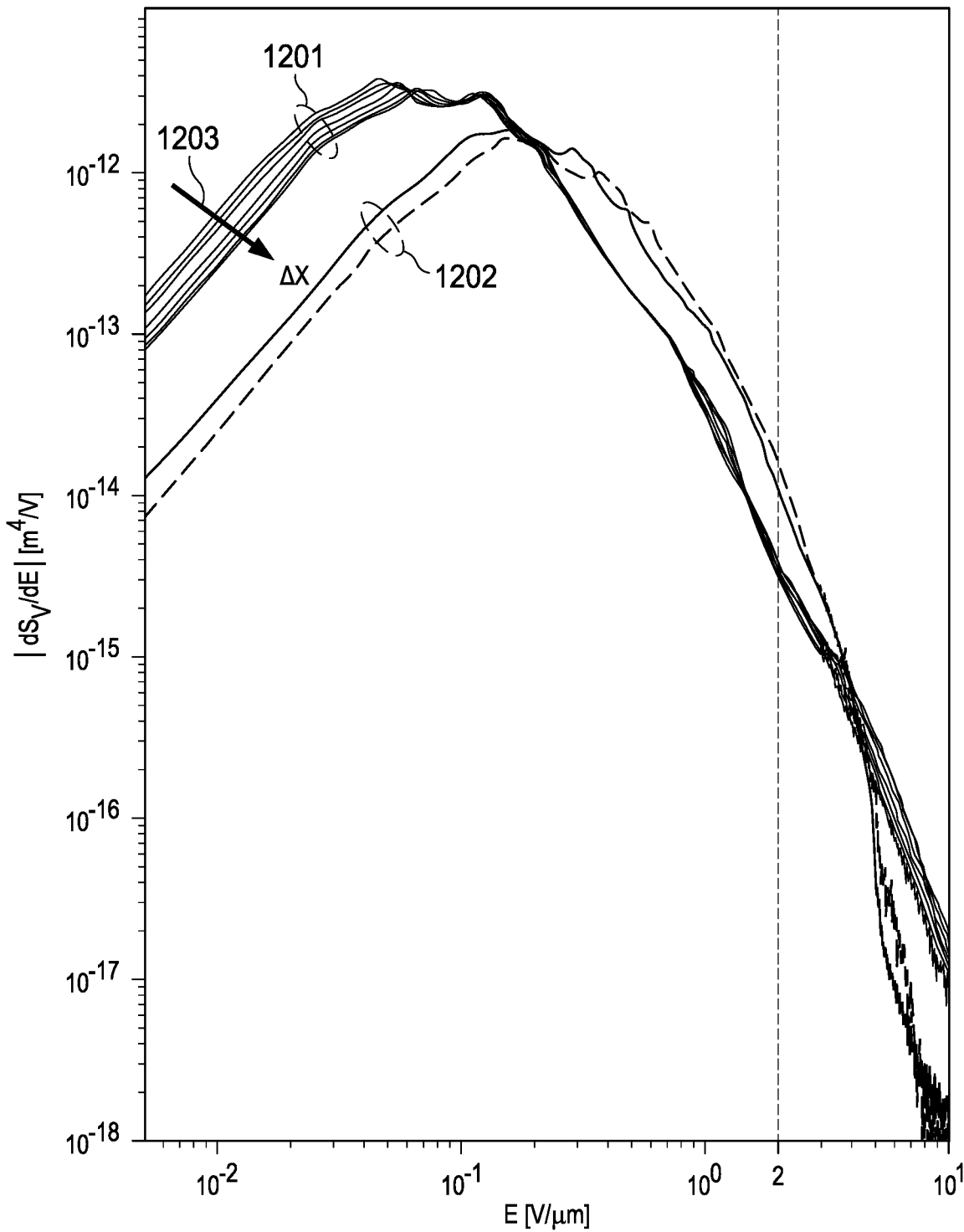
Figure 13:
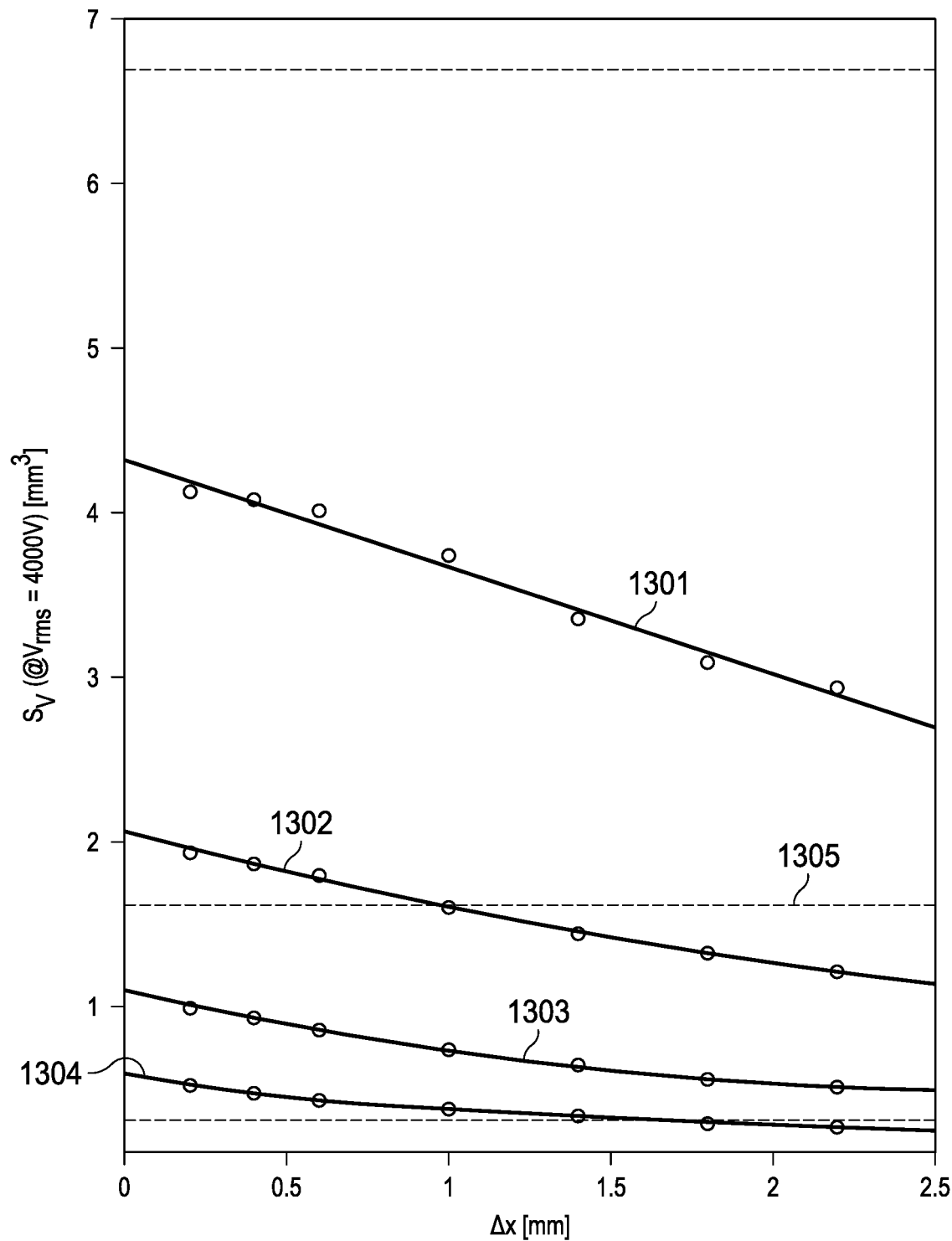

FIGS. 11, 12, and 13 show stress volume performance graphs. FIG. 11 shows a graph 1100 with curves labeled 1101 and 1102 that show stress volume in cubic meters (m$^3$) as a function of applied electric field E (v/μm). The curves 1101 correspond to examples of the electronic device 100 in a system having the first leads 109 coupled to a high voltage node and the second leads 110 coupled to low voltage circuitry. The curves 1102 show the stress volume for example land grid array (LGA) and small outline integrated circuit (SOIC) electronic temperature sensor devices. For comparison, the illustrated curves show stress volume performance in the device structure for 2 v/μm using 4 kvrms potential difference between the high and low voltage nodes. In this example, the packages exhibit some electric field leakage at 4 kvrms, and the trace finger to high side pad lateral distance Δx is shown increasing along the arrow 1103. The electronic device 100 has less stress volume generated as the trace finger (e.g., conductive traces 114) to pad (e.g., die pad 107) spacing Δx is increased as shown by the curves 1101. The proposed design generates less electric than the existing devices below 3 v/μm. The proposed design can be improved with multilayer substrate approach by implementing shielding layers.

A graph 1200 in FIG. 12 shows stress volume rate (e.g., $ds_V/dE$) with electric field spectrum including curves labeled 1201 and 1202 that show stress volume rate in m$^4$/v as a function of applied electric field E (v/μm). The curves 1201 correspond to examples of the electronic device 100 in a system having the first leads 109 coupled to a high voltage node and the second leads 110 coupled to low voltage circuitry. The curves 1202 show the stress volume for example LGA and SOIC devices. In this example, the peak stressed volume rates occur at low stress values, and the trace finger to high side pad lateral distance Δx is shown increasing along the arrow 1203.

FIG. 13 shows a graph 1300 of the stress volume as a function of the trace finger to high side pad lateral distance Δx in mm for the packaged electronic device 100, including a curve 1301 showing the stress volume at an electric field strength of 2 v/μm, a curve 1302 showing the stress volume at an electric field strength of 3 v/μm, a curve 1303 showing the stress volume at an electric field strength of 4 v/μm, a curve 1304 showing the stress volume at an electric field strength of 5 v/μm, and a line 1305 that shows the stress volume of an LGA device.

Figure 14:
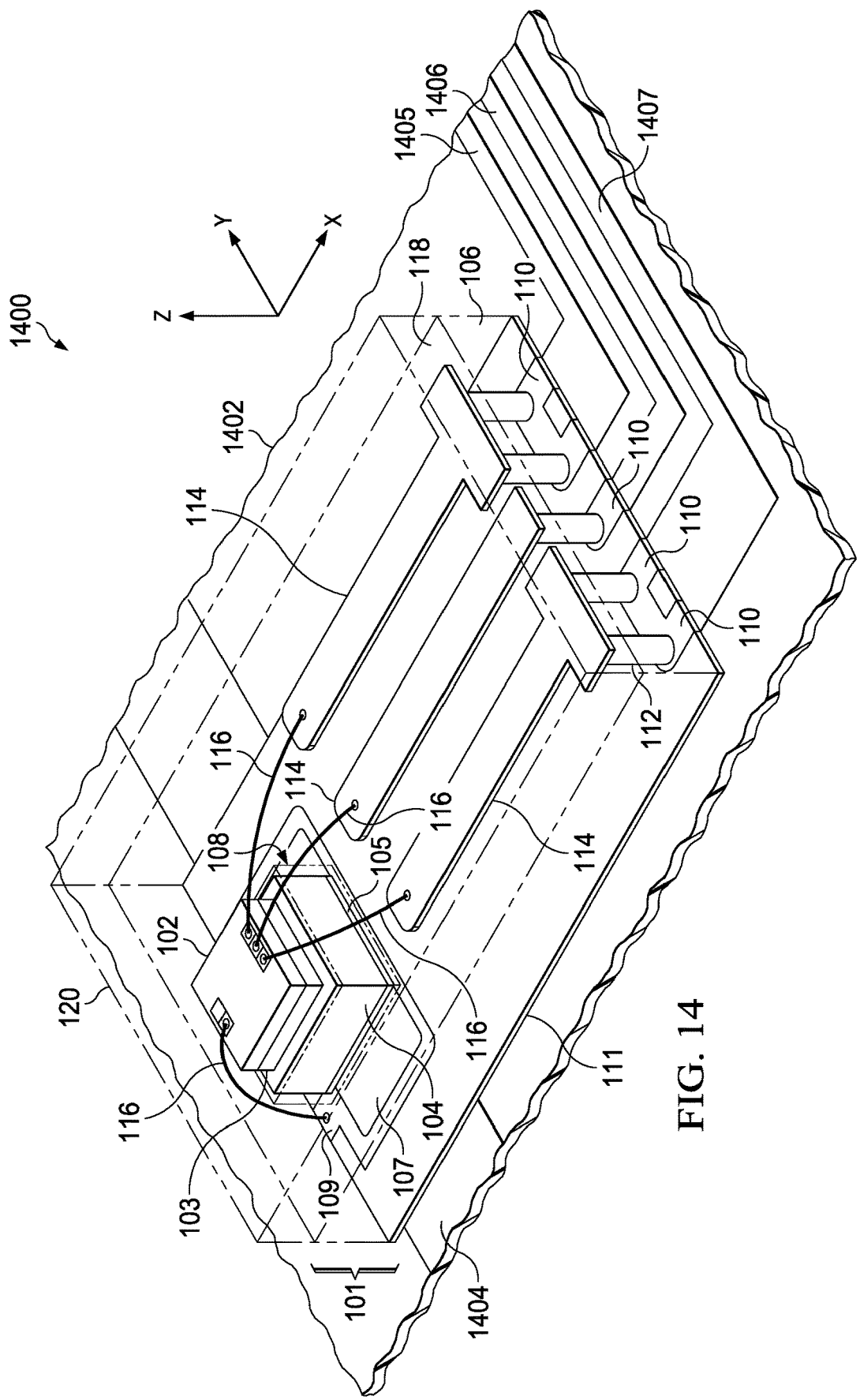
FIG. 14 is a partial top perspective view of the packaged electronic device of FIG. 1 on a printed circuit board to sense a bus bar trace temperature.

FIG. 14 shows a partial top view of a high voltage system 1400 with the packaged electronic device 100 mounted on a printed circuit board 1402. The die pad 107 in this example is thermally coupled to the conductive circuit board trace 1404, for example, by direct contact or soldering. The temperature sensor of the semiconductor die 102 senses the temperature of the high voltage bus bar circuit board trace 1404. In this example, respective ones of the second leads 110 are connected to low voltage circuitry by circuit board traces 1405, 1406, and 1407. The dielectric spacer 104 thermally couples the semiconductor die 102 to the circuit board trace 1404 and provides electrical isolation between the high voltages of the circuit board trace 1404 and the low voltage circuitry of the semiconductor die 102 and circuits coupled to the circuit board traces 1405, 1406, and 1407.

Described examples provide solutions to high voltage temperature sensing systems and devices and mitigate electric field leakage outside of the package using a variety of different package dielectric types such as laminate or molded dielectric layers for isolated temperature sensors with a dielectric spacer embedded in the substrate in an opening of the dielectric layer. The dielectric spacer has high thermal conductivity to allow the heat to conducted to the semiconductor die and the described arrangements can be implemented in molded or laminate-based substrates, thin profile package substrate and other types and forms of package substrates with a dielectric spacer embedded in the laminate substrate in an opening of a dielectric layer. The arrangements of the described examples enable location of the low voltage conductive traces (e.g., fingers 114) to have low electric fields external to the package and described examples have as good as or better external electric field levels than the existing basic isolation devices.

Modifications are possible in the described examples, and other implementations are possible, within the scope of the claims.

What is claimed is:

1. An electronic device, comprising:
   a substrate having a dielectric layer, a die pad, a first lead, a second lead, a conductive via, and a conductive trace, the dielectric layer having a side and an opening that extends into the side, the die pad coupled to the first lead, the second lead coupled to the conductive via, the conductive trace coupled to the conductive via, and the conductive trace extending on the side of the dielectric layer;
   a dielectric spacer above the die pad in the opening;
   a semiconductor die above the dielectric spacer, the semiconductor die including a temperature sensor;
   an electrical connection that couples the semiconductor die to the conductive trace; and
   a package structure that extends on the side of the dielectric layer, on the semiconductor die, and on the conductive trace, the package structure extending around the dielectric spacer and to the die pad in the opening.

2. The electronic device of claim 1, wherein the dielectric layer is a laminate layer.

3. The electronic device of claim 1, wherein the dielectric layer is a molded layer.

4. The electronic device of claim 1, wherein the dielectric spacer has a thermal conductivity of greater than 10 W/mK.

5. The electronic device of claim 1, wherein the dielectric spacer includes aluminum oxide, aluminum nitride, or aluminum oxynitride.

6. The electronic device of claim 1, further comprising:
 a first die attach film that adheres the semiconductor die to the dielectric spacer; and
 a second die attach film that adheres the dielectric spacer to the die pad.

7. The electronic device of claim 1, wherein the dielectric spacer has a thickness of 50 to 500 μm.

8. The electronic device of claim 1, wherein the electrical connection is a bond wire.

9. The electronic device of claim 1, wherein the substrate is one of a lead frame, a partially etched lead frame, a pre-molded lead frame, and a molded interconnect substrate.

10. A system, comprising:
 a printed circuit board (PCB) having a conductive PCB trace; and
 an electronic device mounted to the PCB, the electronic device comprising:
  a substrate having a dielectric layer, a die pad, a first lead, a second lead, a conductive via, and a conductive trace, the die pad thermally coupled to the conductive PCB trace, the dielectric layer having a side and an opening that extends into the side, the die pad coupled to the first lead, the second lead coupled to the conductive via, the conductive trace coupled to the conductive via, and the conductive trace extending on the side of the dielectric layer;
  a dielectric spacer above the die pad in the opening;
  a semiconductor die above the dielectric spacer, the semiconductor die including a temperature sensor;
  an electrical connection that couples the semiconductor die to the conductive trace; and
  a package structure that extends on the side of the dielectric layer, on the semiconductor die, and on the conductive trace, the package structure extending around the dielectric spacer and to the die pad in the opening.

11. The system of claim 10, wherein the dielectric spacer has a thermal conductivity of greater than 10 W/mK.

12. The system of claim 10, wherein the dielectric spacer includes aluminum oxide, aluminum nitride, or aluminum oxynitride.

13. The system of claim 10, further comprising:
 a first die attach film that adheres the semiconductor die to the dielectric spacer; and
 a second die attach film that adheres the dielectric spacer to the die pad.

14. The system of claim 10, wherein the electrical connection is a bond wire.

15. The system of claim 10, wherein the substrate is one of a lead frame, a partially etched lead frame, a pre-molded lead frame, and a molded interconnect substrate.

* * * * *